(12) United States Patent
Knopp

(10) Patent No.: US 7,539,923 B1
(45) Date of Patent: May 26, 2009

(54) CIRCUIT AND METHOD OF TRANSMITTING A BLOCK OF DATA

(75) Inventor: Tomai Knopp, Bernalillo, NM (US)

(73) Assignee: Xilinx, Inc., San Jose, CA (US)

( * ) Notice: Subject to any disclaimer, the term of this patent is extended or adjusted under 35 U.S.C. 154(b) by 357 days.

(21) Appl. No.: 11/498,367

(22) Filed: Aug. 3, 2006

(51) Int. Cl.
*G11C 29/00* (2006.01)

(52) U.S. Cl. ...................... 714/766; 714/719

(58) Field of Classification Search ........ None
See application file for complete search history.

(56) References Cited

U.S. PATENT DOCUMENTS 7,051,264 B2 * 5/2006 Leung et al. .............. 714/763
7,299,399 B2 * 11/2007 Huang ...................... 714/757
2004/0098654 A1 * 5/2004 Cheng et al. .............. 714/758

* cited by examiner

*Primary Examiner*—Christine T Tu
(74) *Attorney, Agent, or Firm*—John J. King

(57) ABSTRACT

A circuit for transmitting a block of data is disclosed. The circuit comprises a memory array having a plurality of memory locations coupled to receive data; a first data source coupled to the memory array, wherein data from the first data source is stored at sequential addressable memory locations of the plurality of memory locations on a first in, first out basis; a second data source coupled to the memory array, the second data source providing data to be stored in a predetermined memory location of the sequential addressable memory locations storing data from the second data source; and a selection circuit coupled to the first data source and the second data source for selecting data to be stored in the plurality of memory locations.

17 Claims, 5 Drawing Sheets

500

CIRCUIT AND METHOD OF TRANSMITTING A BLOCK OF DATA

FIELD OF THE INVENTION

The present invention relates generally to integrated circuits, and in particular, to a circuit for and method of transmitting a block of data.

BACKGROUND OF THE INVENTION

Data may be sent between a transmitter and a receiver according to one of many data transfer protocols. Data transfer protocols generally include protocols defined by industry standards bodies or proprietary protocols. While the various protocols may have advantages and disadvantages, a data transmission protocol may be selected to optimize the transmission of data according to the application using the protocol. Regardless of the selected protocol, most data transmission protocols require error checking. Error checking may be an error detection protocols indicating that an error exists without identifying the location of the error. Alternatively, error correction protocols enable both error detection and correction. In either case, data representative of the data block is transmitted with the data to enable the receiver to determine whether an error exists in the data.

One example of a data transmission protocol is the User Datagram Protocol (UDP). UDP is a connectionless, packet-based data transmission protocol used in internet protocol (IP) networks, primarily for broadcasting messages over an IP network. For example, many VoIP applications use UDP for the voice data transmission. Each packet on the network is called a UDP datagram comprising of a small header and user data. Because UDP is connectionless, a datagram may be sent without advance notice, and there is no guarantee that the datagram will be delivered to the destination host. Accordingly, the application using UDP must be prepared to handle errors, including missing datagrams, such as through error detection and correction.

In order to implement the UDP standard, a checksum must be sent with the data packet. In particular, a checksum of the datagram is calculated and then placed into the header of the same packet. However, the header is located at the beginning of the packet for which the checksum is generated. Unlike most error correction/detection architectures where the checksum is located at the end of the packet or at the beginning of the next packet, the requirement that the checksum be placed in the header of the packet being transmitted creates a problem because it is not possible to calculate the checksum as the data is being transmitted. That is, by the time the checksum is obtained, the data in the location for storing the checksum will have already been sent. Accordingly, the checksum must be calculated before the packet is transmitted.

Conventional circuits implementing the UDP standard calculate a checksum while the packet is written into a first-in, first out (FIFO) memory. The checksum is calculated at this location and placed in a separate FIFO after all of the data has been loaded into the FIFO. The checksum will be read out at the correct time and replace the data coming out of the main data FIFO when the checksum timeslot is present, increasing the circuitry required to transmit the block of data including the checksum. As shown in FIG. 1 for example, separate FIFOs 102 and 104 are required to transmit data where a checksum is inserted at a location other than at the end of the data stream. The first FIFO 102 receives a write enable (Wr_En) signal and a write data (Wr_Data) signal from a circuit, such as a direct memory access (DMA) circuit 106. A Transmit Checksum block 108 also receives the Wr_En signal and the Wr_Data signal in order to generate an error detection value comprising a checksum to be used by the receiver to determine the presence of an error. The transmit checksum block 108 may then transmit a sideband write enable (SB_Wr_En) signal and sideband data (SB_Data) comprising a checksum. Because there is no means to write to the FIFO 102 other than on a first in, first out basis, the checksum must be stored in the separate FIFO 104. A control circuit 110 couples a select signal to a multiplexer 112 to select the output of one of the FIFOs 102 and 104. Accordingly, the control circuit and multiplexer enables the transmission of the checksum at a location other than at the end of the data stream using two separate FIFOs. For example, the output of FIFO 104 containing the checksum may be transmitted at the beginning the block of data for which the checksum is calculated.

However, the use of a separate FIFO has a number of disadvantages. For example, the FIFO holding the checksum is not trivial in size. Some form of RAM to hold the data and full read and write pointers would be required. A state machine would also be required to read the checksum and insert the checksum into the data stream. In designing for the worst case, the checksum FIFO depth would be nearly equal to the depth of the main data FIFO, and for a 32 bit data path, the checksum FIFO would be nearly as wide. Such a use of a checksum FIFO is an inefficient use of logic in an integrated circuit implementing a data transmission protocol. For example, in a programmable logic device where the efficient use of logic resources is important, the requirement for two FIFOs to implement the data transmission protocol is particularly inefficient.

Accordingly, there is a need for an improved circuit for and method of transmitting data.

SUMMARY OF THE INVENTION

A circuit for transmitting a block of data is disclosed. The circuit comprises a memory array having a plurality of memory locations coupled to receive data; a first data source coupled to the memory array, wherein data from the first data source is stored at sequential addressable memory locations of the plurality of memory locations on a first in, first out basis; a second data source coupled to the memory array, the second data source providing data to be stored in a predetermined memory location of the sequential addressable memory locations storing data from the first data source; and a selection circuit coupled to the first data source and the second data source for selecting data to be stored in the plurality of memory locations. According to one embodiment, the circuit comprises a direct memory access circuit, while the second data source comprises an error detection circuit, such as a transmit checksum circuit. Further, the memory comprises a partitioned memory having a first portion for storing data on a first in, first out basis, and a second portion for storing data in addressable RAM locations.

A circuit for transmitting a block of data, the circuit comprising a memory array having a plurality of memory locations coupled to receive the block of data; a direct memory access circuit coupled to the memory array, wherein data from the direct memory access circuit is stored at sequential addressable memory locations of the plurality of memory locations on a first in, first out basis; an error detection circuit coupled to the memory array, the error detection circuit providing data to be stored in a predetermined memory location of the plurality of memory locations having data from the direct memory access circuit; and a selection circuit coupled to the direct memory access circuit and the error detection circuit for selecting data to be stored in the memory array. The circuit may further comprise a write address controller, the write address controller enabling the data from the direct memory access circuit to be stored at sequential addressable memory locations of the plurality of memory locations on a first in, first out basis. The data read out of the memory array may comprise a block of data having a checksum from the checksum circuit for the block of data at a location other than the last memory location read from the memory.

A method of transmitting a block of data is also disclosed. The method comprises steps of coupling data to a memory array having a plurality of memory locations; storing data in the memory array on a first in, first out basis; replacing data in a memory location having data stored in the first in, first out basis with new data; and reading out the data of said plurality of memory locations having data stored on a first in, first out basis. The method may further comprise a step of storing a dummy value at a predetermined memory location, wherein the step of replacing data in a memory location comprises a step of replacing the dummy value with an error detection value.

DETAILED DESCRIPTION OF THE DRAWINGS

Figure 1:
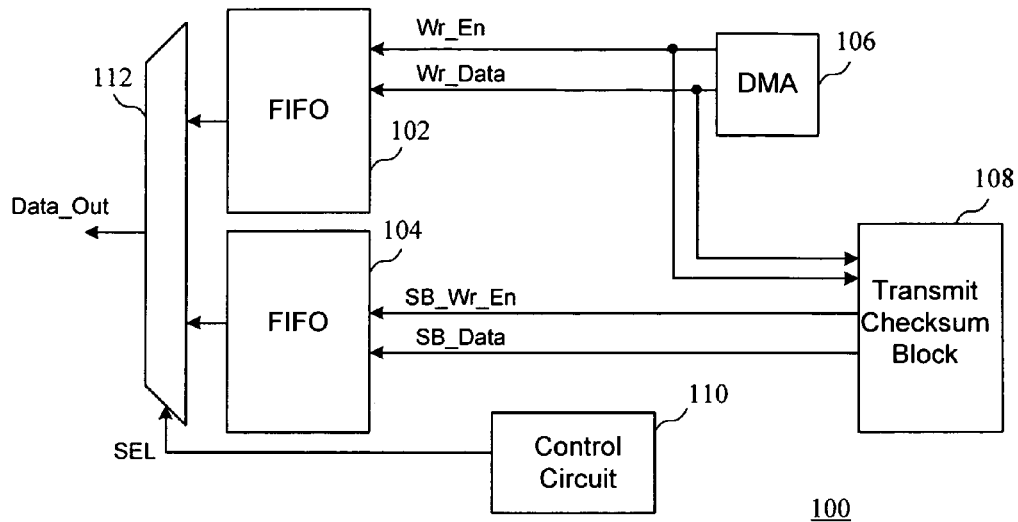
FIG. 1 is a block diagram of a conventional circuit for transmitting data.
Figure 2:
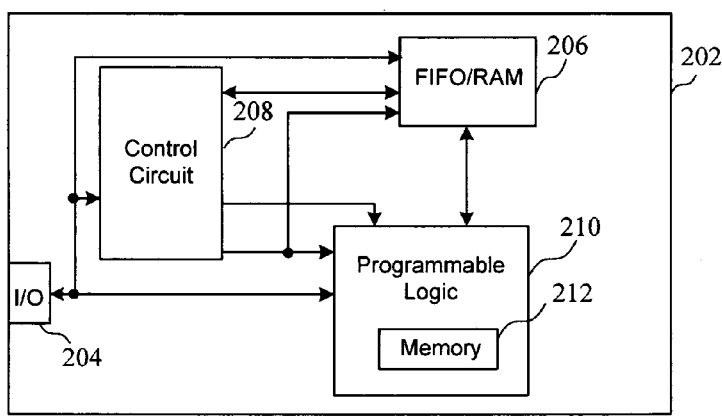
FIG. 2 is a block diagram of an integrated circuit having a combined FIFO/RAM according to an embodiment of the present invention.

Turning first to FIG. 2, a block diagram of an integrated circuit having a combined FIFO/RAM according to an embodiment of the present invention is shown. An integrated circuit 202 comprises an input/output block 204 coupled to receive data from and transmit data to an external circuit. The data may be transmitted directly to or from a combined FIFO/RAM 206, or by way of a control circuit 208. The control circuit 208 is further coupled to a programmable logic circuit 210 comprising a memory for configuring programmable logic of the programmable logic circuit. The integrated circuit 202 may be a configurable logic device, which will be described in more detail below, or any device having configurable logic, such as an application specific integrated circuit (ASIC) having programmable logic.

Figure 3:
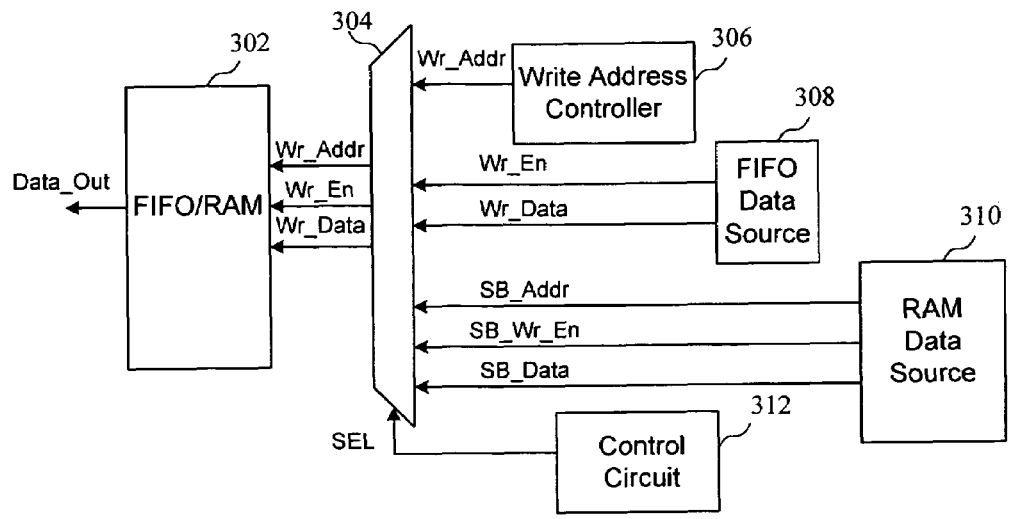
FIG. 3 is a block diagram of a circuit implementing the combined FIFO/RAM according to an embodiment of the present invention.

Turning now to FIG. 3, a block diagram of a circuit implementing a combined FIFO/RAM according to an embodiment of the present invention is shown. In particular, the FIFO/RAM 302 comprises a plurality of memory locations. In a programmable logic device, the memory elements may be configurable to have different dimensions comprising rows and word lengths. The FIFO/RAM 302 is coupled to receive the output of a multiplexer 304 comprising a write address (Wr_Addr) from a write address controller 306, and a write enable (Wr_En) signal and a write data (Wr_Data) signal from a DMA circuit 308. A RAM data source 310 is also coupled to the multiplexer 304, and generates a sideband address (SB_Addr), a sideband write enable (SB_Wr_En) signal and a sideband data (SB_Data) signal. The FIFO data source may be any circuit for providing data to be stored in the FIFO/RAM. The data stored in the FIFO/RAM preferably contains one or more dummy words which are to be replaced by data from the RAM data source 310. The RAM data source circuit may be any type of data source for storing data in a memory location of the FIFO/RAM 302.

A control circuit 312 provides a selection signal to the multiplexer 304 to enable the selection of data to be stored in the FIFO/RAM 302. As data is written into the FIFO/RAM, a predetermined location in the FIFO/RAM is loaded with either a pseudo header or all zeros, and will be overwritten with data from a RAM data source. Preferably, the control circuit selects the output of the RAM data source 310 after data from the FIFO data source as been loaded into the FIFO/FRAM to enable the dummy data stored at the predetermined location identified by SB_Addr to be replaced with data from the RAM data source. By enabling access to the control signals on the FIFO/RAM as shown and described in reference to FIG. 3, the FIFO/RAM may be utilized as both a FIFO and a RAM. As will be described in more detail in reference to FIG. 4, a circuit having a combined FIFO/RAM finds particular application in a circuit implementing a checksum, and in particular, a checksum application where a checksum is inserted in a location other than the end memory location of a block of data for which the checksum is generated.

Figure 4:
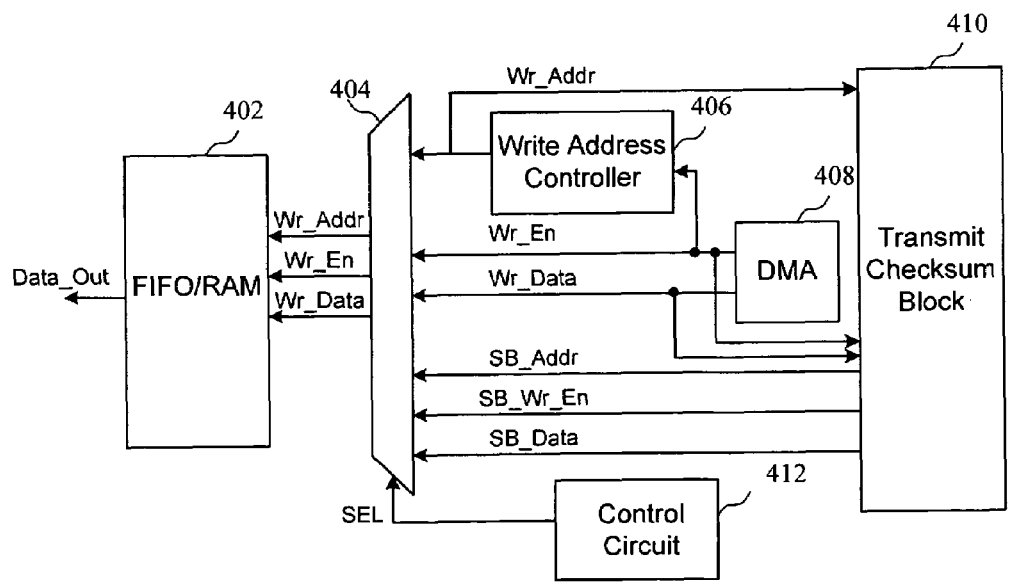
FIG. 4 is a block diagram of a circuit implementing the combined FIFO/RAM according to an alternate embodiment of the present invention.

Turning now to FIG. 4, a block diagram of a circuit implementing the combined FIFO/RAM according to an alternate embodiment of the present invention is shown. In particular, the circuit of FIG. 4 enables inserting a checksum at any location of a RAM implemented as a FIFO by enabling addressing memory locations of the FIFO. The FIFO/RAM 402 is coupled to receive the output of a multiplexer 404 comprising a write address (Wr_Addr) from a write address controller 406, and a write enable (Wr_En) signal and a write data (Wr_Data) signal from a data circuit, such as a direct memory access (DMA) circuit 408. An error detection circuit such as a transmit checksum block 410 is also coupled to the multiplexer 404, and generates a sideband address (SB_Addr), a sideband write enable (SB_Wr_En) signal and a sideband data (SB_Data) signal.

As data is written into the FIFO/RAM, the checksum location is loaded with a dummy value, such as a pseudo header or all zeros which will be overwritten with the checksum. As the rest of the packet is written into the FIFO/RAM the checksum is calculated. At the end of packet, the calculated checksum is written into the FIFO/RAM at the address having the dummy value. As set forth above, the address may be an address other than the next pointer location. By employing a multiplexer to couple signals on the data and address lines of the RAM which the FIFO is using, the requirement for a separate checksum FIFO and checksum read state machine is eliminated as the checksum is already placed in the correct location in the main data FIFO. The configuration of the circuit of FIG.

4 provides in an efficient use of resources and a simplification of the entire checksum design to enable checksum offloading. While the circuit of FIG. 4 relates to the placement of an error detection value such as a checksum at a predetermined location of a block of data for which the checksum represents, such as in a UDP data transmission protocol, the FIFO/RAM may be used by any type of data transmission protocol, or any other application requiring that data be placed in a memory location storing data stored in a first in, first out basis.

Figure 5:
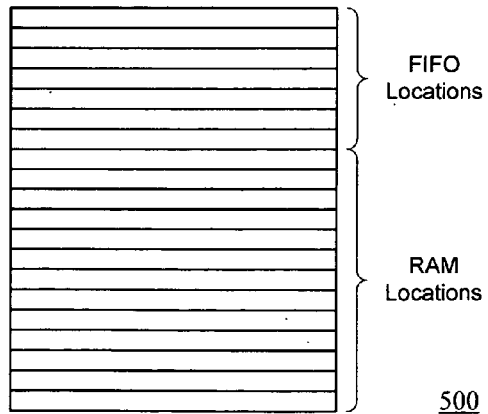
FIG. 5 is a block diagram of a memory array according to an embodiment of the present invention.

Turning now to FIG. 5, a block diagram of a memory array according to an embodiment of the present invention is shown. As shown in FIG. 5, a RAM 500 comprises a first portion having FIFO locations and a second portion having memory locations for dedicated RAM storage. In certain applications, the number of memory locations required for FIFO storage may be less than the available memory locations of the RAM. Accordingly, additional memory locations of the RAM may be available for using as addressable memory locations. That is, the RAM 500 of FIG. 5 may be used as a FIFO/RAM 302 or 403, where a RAM data source may be used to replace dummy data of the first portion comprising FIFO locations and load other data in the second portion comprising RAM locations. Alternatively, a separate RAM data source may be used to load data into the second portion of the RAM.

Figure 6:
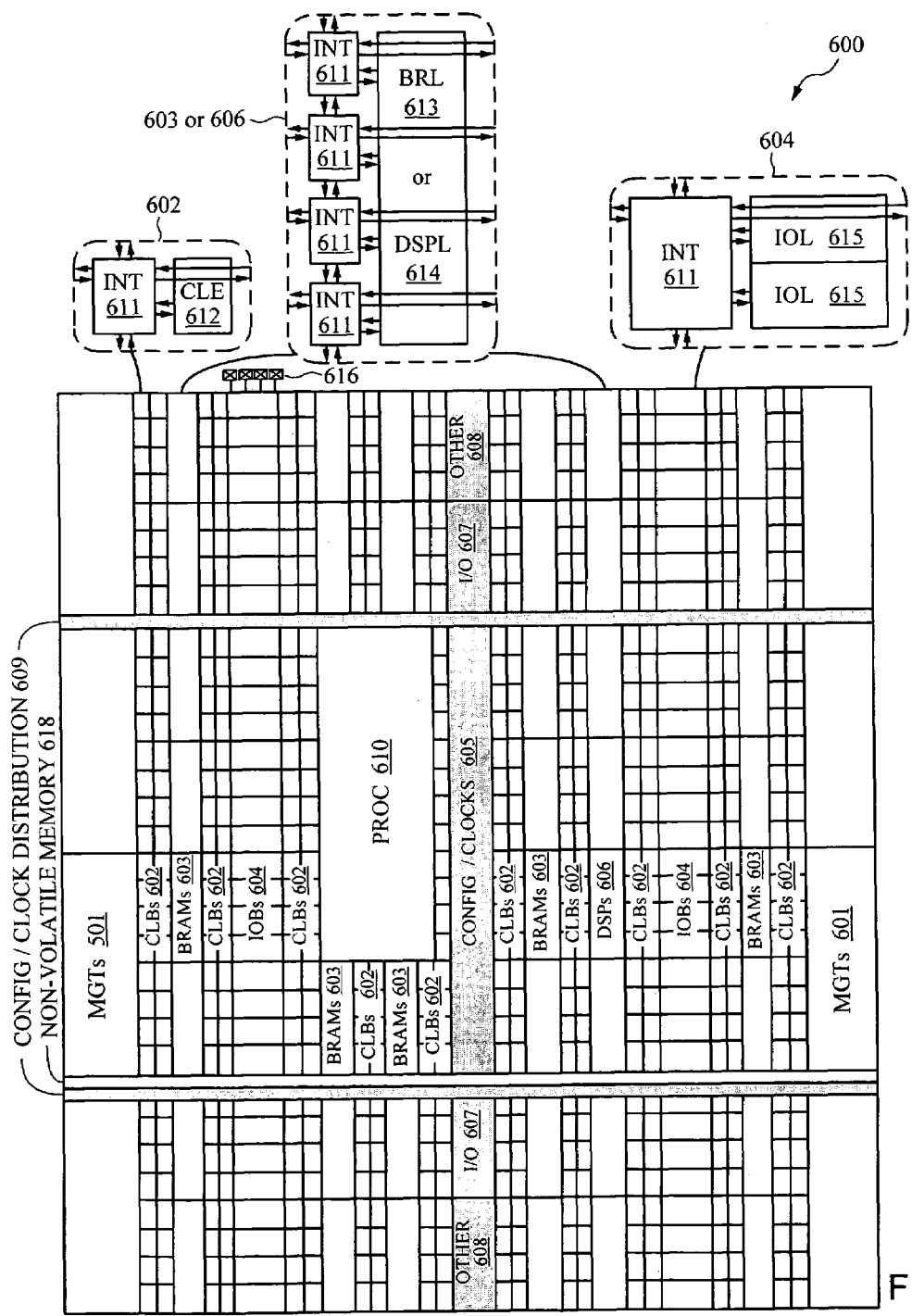
FIG. 6 is a block diagram of a programmable logic device incorporating a combined FIFO/RAM according to an embodiment of the present invention.

Turning now to FIG. 6, a block diagram of a programmable logic device incorporating a combined FIFO/RAM according to an embodiment of the present invention is shown. A programmable logic device is one type of integrated circuit which is designed to be user-programmable so that users may implement logic designs of their choices. One type of programmable logic device is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources.

The FPGA architecture 100 of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610). The multiplexers 304 and 404 of FIGS. 3 and 4 may be implemented in the CLBs, for example, while control circuits may also be implemented in CLBs or by a dedicated processor block. Similarly, the FIFO/RAMs 302 and 402 may be implemented in one of the BRAMs.

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 may include a configurable logic element (CLE 612) that may be programmed to implement user logic plus a single programmable interconnect element (INT 611). A BRAM 603 may include a BRAM logic element (BRL 613) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 206 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611). As will be clear to those of skill in the art, the actual I/O pads 616 connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA. Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs. Finally, a non-volatile memory 618 may be employed for on-chip storage of configuration data which is used to configure the configuration logic blocks or other programmable tiles as described above.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 7:
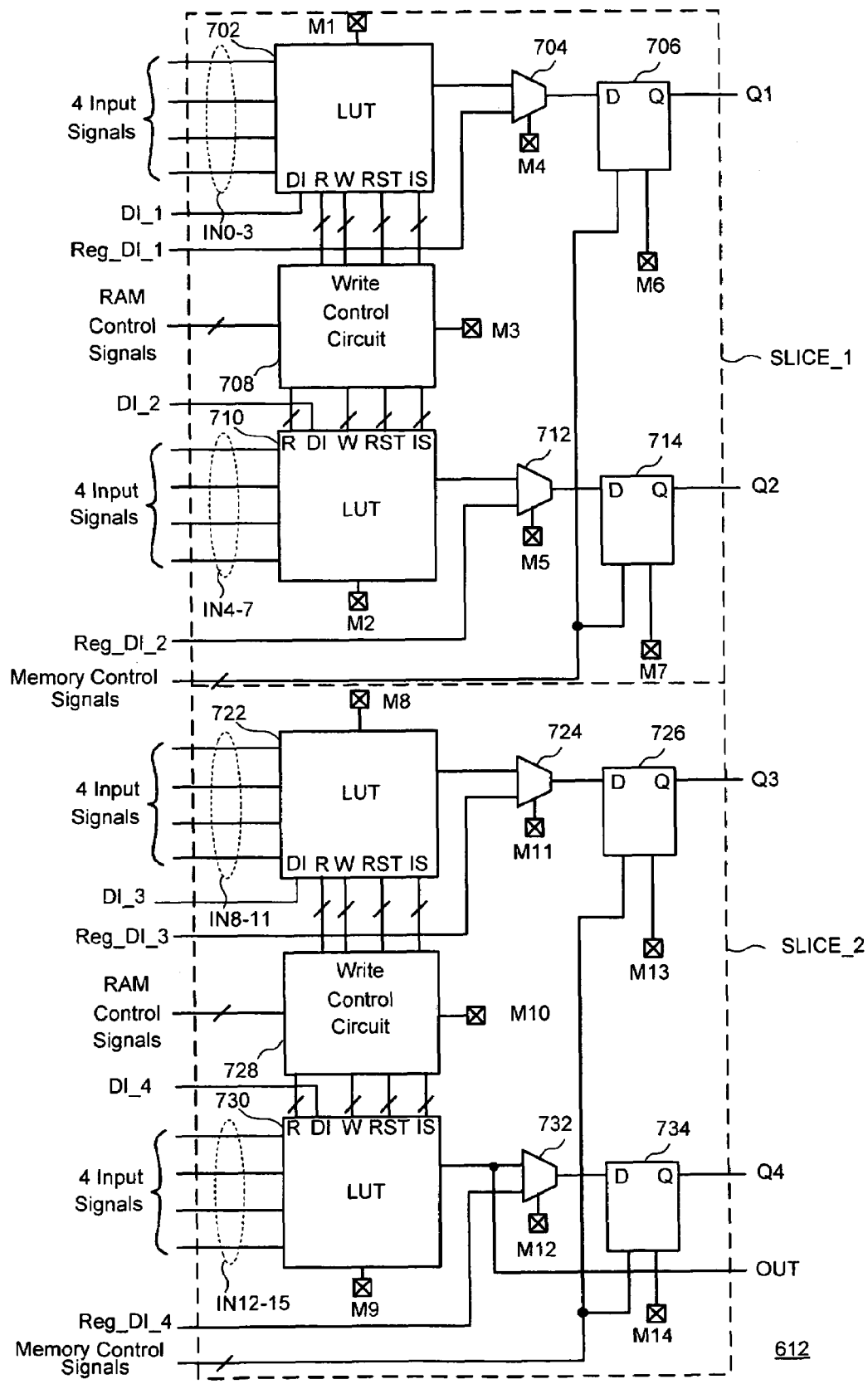
FIG. 7 is a block diagram of a configurable logic element according to an embodiment of the present invention.

Turning now to FIG. 7, a block diagram of a configurable logic element of the programmable logic device of FIG. 6 according to an embodiment of the present invention is shown. In particular, FIG. 7 illustrates in simplified form a configurable logic element of a configuration logic block 602 of FIG. 6. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by an input terminal DI_1, DI_2 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 702 coupled to a multiplexer 704. In particular, the LUT 702 receives 4 input signals which are decoded to generate an output associated with data stored in the LUT at the address designated by the input signals. The multiplexer 304 is adapted to receive the output of LUT 702 and a registered value of Reg_DI_1. The output of the multiplexer 704 is coupled to a register 706 which generates an output Q1.

A Write Control Circuit 708 is coupled to receive RAM control signals and generate signals to control the LUT 702. In addition to a data input (DI) coupled to receive RAM_DI_1 and conventional read and write control signals coupled to a read enable input (R) and a write enable input (W), the LUT 702 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. Similarly, slice 1 comprises a function generator implemented as a LUT 710 coupled to a multiplexer 712. The LUT 710 is adapted to receive input signals IN4-IN7, while the multiplexer 712 is coupled to receive the output of the LUT 710 and a registered value of Reg_DI_2. The output of the multiplexer 712 is coupled to a register 714 which generates an output Q2. The write control circuit 708 also generates a partial reset signal and an initial state signal for selectively resetting or setting one or more of the bits of the LUT 710. One advantage of resetting LUT memory elements of a device during partial reconfiguration is that it is not necessary to cycle through the required clock cycles to set the correct data after the partial reconfiguration.

Similarly, slice 2 comprises a function generator implemented as a LUT 722 coupled to a multiplexer 724. The LUT 722 is adapted to receive input signals IN8-IN11, while the multiplexer 724 is coupled to receive the output of the LUT 722 and a registered value of Reg_DI_3. The output of the multiplexer 724 is coupled to a register 726 which generates an output Q3. A Write Control Circuit 728 is coupled to receive RAM control signals and generate signals to control the LUT 722. In particular, input signals IN8-IN11 are decoded to generate an output associated with data stored in the LUT at the address designated by the input signals. The LUT 722 comprises a partial reset input (RST) for receiving a partial reset signal, and an initial state input (IS) for receiving an initial state signal. Similarly, slice 2 comprises a function generator implemented as a LUT 730 coupled to a multiplexer 732. The LUT 730 is adapted to receive input signals IN12-IN15, while the multiplexer 732 is coupled to receive the output of the LUT 730 and a registered value of Reg_DI_4. The output of the multiplexer 732 is coupled to a register 734 which generates an output Q4. The write control circuit 728 also generates a partial reset signal and an initial state signal for selectively resetting or setting one or more of the bits of the LUT 730.

Figures 8, 9:
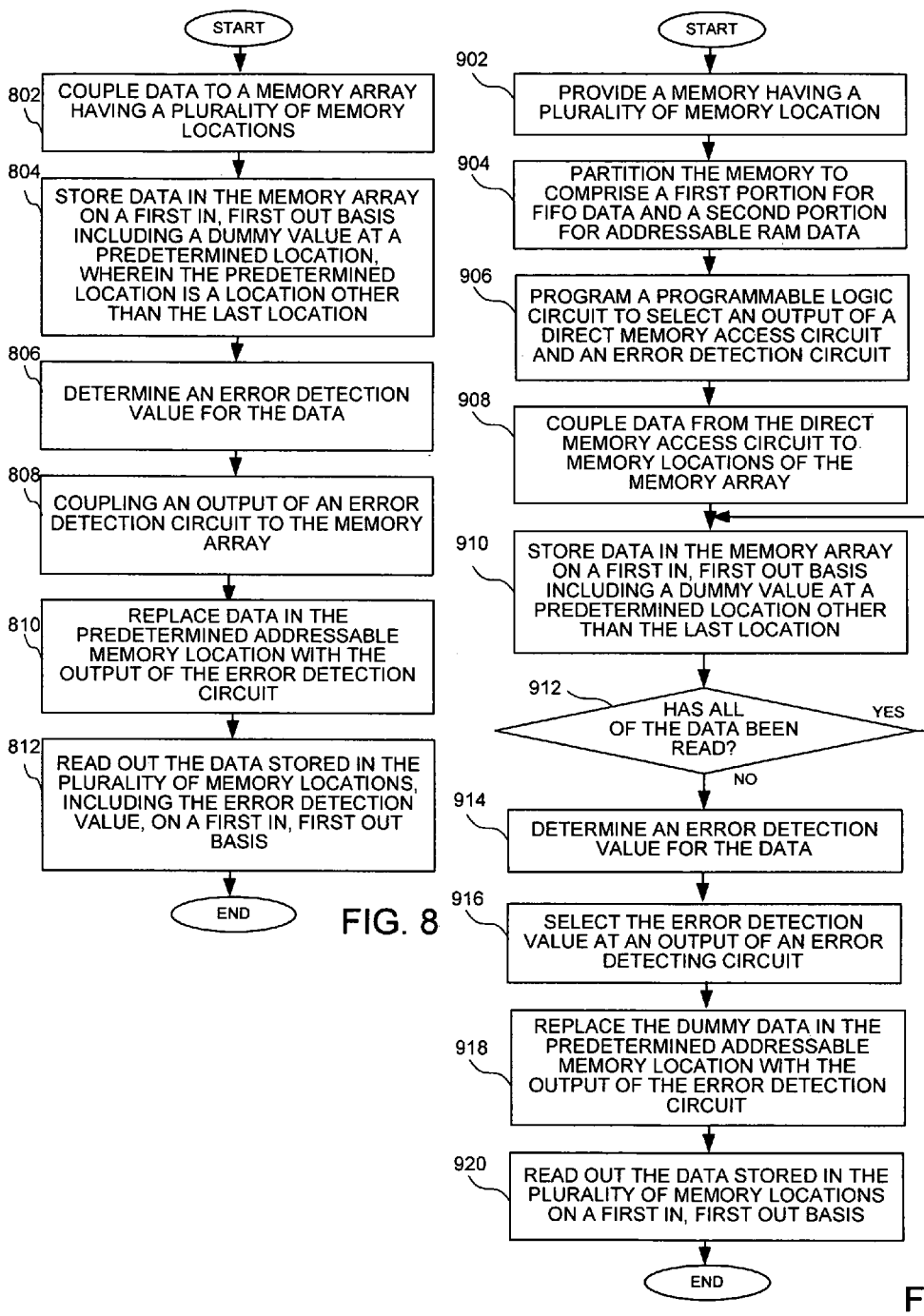
FIG. 8 is a flow chart showing a method of transmitting data according to an embodiment of the present invention.
FIG. 9 is a flow chart showing a method of transmitting data according to an alternate embodiment the present invention.

Turning now to FIG. 8, a flow chart shows a method of transmitting data according to an embodiment of the present invention. In particular, data is coupled to a memory array having a plurality of memory locations at a step 802. Data is stored in the memory array on a first in, first out basis including a dummy value at a predetermined location at a step 804, wherein the predetermined location is a location other than the last location. An error detection value such as a checksum for the data is determined by an error detection circuit at a step 806. The error detection value output by the error detection circuit is coupled to the memory array at a step 808. Data in the predetermined addressable memory location is replaced with the error detection value at a step 810. The data stored in the plurality of memory locations on a first in, first out basis, including the error detection value replacing data in one of the locations, is read out at a step 812.

Turning now to FIG. 9, a flow chart shows a method of transmitting data according to an alternate embodiment the present invention. A memory having a plurality of memory location is provided at a step 902. The memory is partitioned to comprise a first portion for FIFO data and a second portion for addressable RAM data at a step 904. A programmable logic circuit is programmed to select an output of a direct memory access circuit and an error detection circuit at a step 906. Data from the direct memory access circuit is coupled to memory locations of the memory array at a step 908. Data is stored in the memory array on a first in, first out basis including a dummy value at a predetermined location other than the last location at a step 910. It is then determined if all of the data been read at a step 912. An error detection value for the data is determined at a step 914. The error detection value at an output of an error detecting circuit is selected at a step 916. The dummy data in the predetermined addressable memory location is replaced with the output of the error detection circuit at a step 918. The data stored in the plurality of memory locations, including the error detection value replacing the dummy data, is read out on a first in, first out basis at a step 920. The methods of FIGS. 8 and 9 may be implemented using any of the circuits of FIGS. 2-7, or any other suitable circuit.

It can therefore be appreciated that the new and novel circuit for and method of transmitting data has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A circuit for transmitting a block of data, said circuit comprising:
    a memory array having a plurality of memory locations coupled to receive data;
    a first data source coupled to said memory array, said first data source providing data to be stored at sequential addressable memory locations of said plurality of memory locations on a first in, first out basis;
    a second data source coupled to said memory array, said second data source providing data to be stored in a predetermined memory location of said sequential addressable memory locations;
    a selection circuit coupled to said first data source and said second data source for selecting data to be stored in said plurality of memory locations; and
    a control circuit coupled to said selection circuit, said control circuit controlling said selection circuit to enable the selection of data and control signals for storing data from said first data source at each memory location of said sequential addressable memory locations and for overwriting data of said sequential addressable memory locations by storing data from said second data source at said predetermined memory location of said sequential addressable memory locations.

2. The circuit of claim 1 wherein said first data source comprises a direct memory access circuit.

3. The circuit of claim 1 wherein said second data source comprises an error detection circuit.

4. The circuit of claim 1 wherein said selection circuit comprises a multiplexer.

5. The circuit of claim 1 further comprising a write address controller for enabling storing data from said first data source at said sequential addressable memory locations of said plurality of memory locations on a first in, first out basis.

6. The circuit of claim 1 wherein said memory comprises a partitioned memory having a first portion for storing data on a first in, first out basis, and a second portion for storing data in addressable memory locations.

7. A circuit for transmitting a block of data, said circuit comprising:
- a memory array having a plurality of memory locations;
- a direct memory access circuit coupled to said memory array, said direct memory access circuit providing data to be stored at sequential addressable memory locations of said plurality of memory locations on a first in, first out basis;
- an error detection circuit coupled to said memory array, said error detection circuit providing data to be stored in a predetermined memory location of said sequential addressable memory locations;
- a selection circuit coupled to said direct memory access circuit and said error detection circuit for selecting data to be stored in said memory array; and
- a control circuit coupled to said selection circuit, said control circuit controlling said selection circuit to enable the selection of data and control signals for storing data from said direct memory access circuit at each memory location of said sequential addressable memory locations and for overwriting data of said sequential addressable memory locations by storing data from said error detection circuit at said predetermined memory location of said sequential addressable memory locations.

8. The circuit of claim 7 further comprising a write address controller, said write address controller enabling said data from said direct memory access circuit to be stored at sequential addressable memory locations of said plurality of memory locations on a first in, first out basis.

9. The circuit of claim 7 wherein said direct memory access circuit generates a write enable signal and data.

10. The circuit of claim 9 wherein said write enable signal and said data are coupled to said error detection circuit.

11. The circuit of claim 10 wherein said error detection circuit generates an address, a write enable signal, and an error detection value.

12. The circuit of claim 7 wherein said error detection circuit comprises a checksum circuit.

13. The circuit of claim 12 wherein said data read out of said memory array comprises a block of data having a checksum received from said checksum circuit and wherein said predetermined memory location of said sequential addressable memory locations comprises a memory location other than a last memory location of said sequential addressable memory locations.

14. A method of transmitting a block of data, said method comprising the steps of:
- coupling data to a memory array having a plurality of memory locations;
- coupling control signals for writing said data to said memory array on a first in, first out basis;
- storing said data in said memory array on a first in, first out basis, wherein said data stored in said memory array comprises a dummy value in a predetermined memory location;
- coupling control signals for writing an error detection value to said predetermined memory location of said memory array;
- replacing said dummy value in said predetermined memory location with said error detection value; and
- reading out data stored in said plurality of memory locations on a first in, first out basis.

15. The method of claim 14 further comprising a step of providing addresses by a write address controller, wherein said step of storing said data in said memory array on a first in, first out basis comprises storing said data using addresses provided by said write address controller.

16. The method of claim 14 wherein said step of replacing said dummy value in said predetermined memory location comprises selecting said error detection value associated with said data stored in said memory array on a first in, first out basis and generated by an error detection circuit, and storing said error detection value in said predetermined memory location.

17. The method of claim 16 wherein said step of selecting an output of an error detection circuit comprises a step of coupling a multiplexer in programmable logic of a programmable logic device to said memory array for storing data in said memory array.

* * * * *